United States Patent [19]

Faris

[11] Patent Number: 4,518,944

[45] Date of Patent: May 21, 1985

[54] TEMPERATURE STABILIZER

[75] Inventor: Alan E. Faris, Los Angeles, Calif.

[73] Assignee: TRW Inc., Redondo Beach, Calif.

[21] Appl. No.: 542,919

[22] Filed: Oct. 18, 1983

[51] Int. Cl.$^3$ .................. H01C 7/02; H01L 41/08
[52] U.S. Cl. .................................. 338/22 R; 338/24; 310/343
[58] Field of Search .................. 338/22 R–24, 338/25; 310/313 R, 346, 343, 347

[56] References Cited

U.S. PATENT DOCUMENTS

| | | | |
|---|---|---|---|
| 2,396,196 | 3/1946 | Pearson | 338/23 |
| 2,967,924 | 1/1961 | Friend | 310/343 X |
| 3,007,023 | 10/1961 | Johnston et al. | 310/343 X |
| 3,028,473 | 4/1962 | Dyer et al. | 310/343 X |
| 3,381,253 | 4/1968 | Sapoff et al. | 338/22 R |
| 3,393,448 | 7/1968 | Harget et al. | 338/22 R |
| 3,444,399 | 5/1969 | Jones | 338/23 X |
| 3,749,879 | 7/1973 | Armstrong | 310/343 X |
| 4,259,606 | 3/1981 | Vig | 310/343 |
| 4,334,168 | 6/1982 | Besson et al. | 310/343 |

Primary Examiner—Philip H. Leung
Assistant Examiner—C. N. Sears
Attorney, Agent, or Firm—Robert M. Wallace; Noel F. Heal

[57] ABSTRACT

A device for regulating the temperature of an electronic component, such as a surface acoustic wave (SAW) component in a hybrid package, without dissipating large amounts of power. The device includes a positive-temperature-coefficient thermistor positioned in contact with the component of which the temperature is to be controlled, and an insulating body with included air spaces, positioned between the thermistor and the package, to provide a high thermal resistance between the thermistor and the package. In one preferred form of the invention, the insulating body is a length of glass tubing that has been deformed to include two flat surfaces for contacting the thermistor and the package. Another disclosed embodiment includes a second thermistor and insulator combination, to further increase the thermal resistance between the component and the package.

7 Claims, 3 Drawing Figures

TEMPERATURE STABILIZER

BACKGROUND OF THE INVENTION

This invention relates generally to temperature stabilizing devices, and more particularly, to temperature stabilizers including positive-temperature-coefficient (PTC) devices for obtaining a constant temperature environment for electronic components. Most electronic components are relatively insensitive to temperature variations, but some components are extremely sensitive to temperature. In many instances, one of the most critical tasks of a designer of electronic systems is to ensure that the environmental temperature is controlled with sufficient precision to accomodate the temperature-sensitive components in a system.

A device that is sometimes used for temperature control is the positive-temperature-coefficient (PTC) thermistor. When a constant voltage is applied to a PTC thermistor, it heats up until a switching temperature is reached, at which point the electrical resistance of the device begins to increase rapidly with temperature. Thus, the power dissipated, which is inversely proportional to the resistance at constant voltage, decreases rapidly with increasing temperature. An equilibrium temperature is quickly attained, at which the power dissipated is equal to the thermal power leaking to the environment surrounding the device.

Early attempts to control the environmental temperature for electronic components have suggested the use of insulation around the entire electronic package. This is not only a bulky solution, but may also consume relatively large amounts of power in the thermistor, since there will be a large amount of thermal leakage from the thermistor to the outside environment. Moreover, this leakage will result in a relatively long warm-up period before the thermistor reaches its equilibrium temperature.

It has been recognized that it would be advantageous to provide some form of insulation between the thermistor and the package on which it is mounted, to reduce the thermal leakage through the path of least thermal resistance. For example, U.S. Pat. No. 3,158,821 to P. G. Sulzer reaches this conclusion, but does not suggest any specific structure for increasing the thermal resistance of the leakage path. A similar conclusion was reached by B. R. Potter et al. in "Temperature Regulation of LiNbO$_3$ Devices," published in the Proceedings of the 1975 IEEE Ultrasonics Symposium, pp. 499–502. No specific solution was offered, however, and the paper focuses instead on the use of insulation surrounding the entire package.

One important application of temperature stabilization is in conjunction with surface acoustic wave (SAW) devices and related devices that employ shallow bulk acoustic waves (SBAW). These devices operate at frequencies from about 50 megahertz (MHz) to about 2 gigahertz (GHz), and are used as oscillators, resonators, filters, and related components. SAW devices employ metallic electrodes on the surface of a piezoelectric substrate, which is commonly quartz. Quartz has the requisite electro-acoustical properties for SAW devices, and has the additional advantage of being relatively stable over a wide temperature range. Other substrate materials, such as lithium niobate (LiNbO$_3$), have electro-acoustical properties that are far superior to those of quartz, and may therefore be made to operate at higher frequencies and with lower losses. However, the temperature stability of lithium niobate is many times worse than that of quartz, so the use of lithium niobate must frequently be ruled out only because of its temperature stability characteristics.

It will be appreciated from the foregoing that there is still a need for a simple temperature stabilization device that will be effective to control the operating environment of selected electronic components, such as SAW devices, without the dissipation of large amounts of power. Ideally, a temperature stabilizer should be small enough to fit inside hybrid packages, should be relatively inexpensive, and should be constructed from materials that will not contaminate sensitive electronic components in the package. The present invention satisfies this need.

SUMMARY OF THE INVENTION

The present invention resides in a temperature stabilizer for regulating the temperature of an electronic component without consumption of large amounts of power, and without the use of insulation to surround the entire package in which the component is located. Basically, and in general terms, the temperature stabilizer of the invention comprises a positive-temperature-coefficient thermistor located in contact with the component whose temperature is to be regulated, and an insulating body mounted between the thermistor and the package, the insulating body being of a material that produces no contaminant gases, and having included air spaces to increase the thermal resistance of the path between the thermistor and the package.

More specifically, the insulating body includes a length of tubing that has been compressed to provide two flat surfaces for contact with the thermistor and with the package, respectively, and the included air space is provided by the interior volume of the tubing. Preferably, the tubing is made of glass, which has the advantage of producing no contaminant material when heated. By way of contrast, some plastics, although good insulators, out-gas materials that significantly affect the operation of SAW devices.

In accordance with another aspect of the invention, temperature stability is even further improved by the duplication of the thermistor and insulator components. Specifically, the structure further includes a second positive-temperature-coefficient thermistor and a second insulating body. The second thermistor is positioned in contact with the first insulating body, and the second insulating body is positioned between the second thermistor and the package, to provide a second thermistor and insulator combination that is thermally in a series connection with the first thermistor and insulator combination.

It will be appreciated from the foregoing that the present invention represents a significant advance in the packaging of electronic components that are sensitive to variations in temperature. In particular, the invention provides a low-cost and convenient technique for the temperature-compensation of electronic components. Moreover, the device of the invention does not contaminate sensitive components, such as SAW devices, uses relatively little power, and has a very rapid warm-up time. Other aspects and advantages of the invention will become apparent from the following more detailed description, taken in conjunction with the accompanying drawings.

DESCRIPTION OF THE PREFERRED EMBODIMENTS

Figure 1:
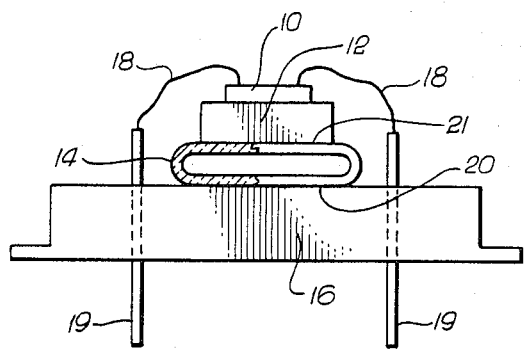
FIG. 1 is an elevational view of one form of the temperature stabilizer of the invention.

As shown in the drawings for purposes of illustration, the present invention is concerned with devices for the stabilizaton of temperature, particularly for use with temperature-sensitive electronic components, such as surface acoustic wave (SAW) devices. Prior attempts to regulate the temperature of such devices have required relatively large amounts of power, and have resulted in only fair operating characteristics.

In accordance with the invention, an electronic component, indicated by reference numeral 10, has its environmental temperature regulated by a positive-temperature-coefficient (PTC) thermistor 12 operating in conjunction with an insulating body 14 positioned between the thermistor and a package 16 on which the component is to be mounted. More specifically, the component 10 is mounted in thermal contact with the PTC thermistor 12, which, as is well known, dissipates less power as the temperature increases, and reaches an equilibrium temperature dependent on the rate of thermal leakage from the device.

The insulating body 14 is positioned between the PTC thermistor 12 and the package 16, providing a low thermal conduction (e.g. less than 0.01 watt/cm-degree C.) from the thermistor to the package, which would otherwise act as a heat sink for the device. Of course, there will be some loss of heat through electrical connections 18 to the component, and thence to pins 19 in the package 16, but the principal heat leakage path is normally through any direct contact between the component and its package. Heat flow along this path is now greatly reduced by the insulating body 14.

The insulating body 14 shown in FIG. 1 can best be described as a "squashed" glass tube. A length of flint glass tubing is flattened on opposite sides to form two flat surfaces 20 and 21 for good thermal contact with the thermistor 12 and the package 16, respectively, leaving a substantial air space within the tube to enhance its insulative properties. Depending on the size of the structure, it may be desirable to include integral structural supports (not shown) within the body 14.

Figure 2:
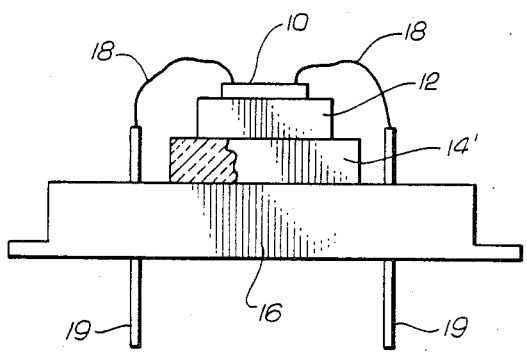
FIG. 2 is an elevational view of an alternate form of the invention.

FIG. 2 shows an alternative structure, in which the insulating body, indicated by 14', is a ceramic material having included air spaces within its cellular structure. The insulating effect of this structure is similar to that of the tube structure of FIG. 1.

Figure 3:
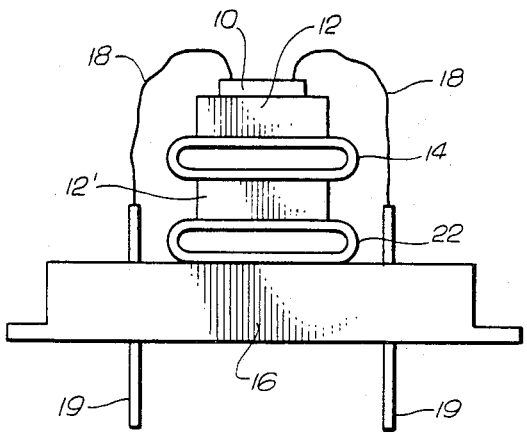
FIG. 3 is and elevational view of yet another embodiment of the invention.

FIG. 3 shows another alternative configuration that may be necessary for some applications requiring even more precise temperature regulation. A second PTC thermistor 12' and a second insulating body 22 are interposed between the first insulating body 14 and the package 16, to form a second thermistor-insulator combination connected thermally in series with the first. Laboratory testing has shown that the stabilizer of FIG. 1 can achieve temperature regulation up to a factor of eighteen, i.e. a temperature fluctuation of 18 degrees in the environmental temperature will result in only a one-degree variation in the temperature of the electronic component 10. The warm-up time of the device is an order of magnitude less than the warm-up time using insulation around the entire package. The embodiment of FIG. 3 is basically two of the FIG. 1 structures connected in series, and is estimated to provide a regulated temperature that varies by approximately only one three-hundredth of the environmental temperature fluctuation. Actual performance will depend on such factors as the number and thermal conductivity of the electrical connections 18 to the component.

In a test of the device of FIG. 1, the power consumption of the thermistor 12 was only 0.25 watt at an ambient temperature of −70 degrees C. At an ambient temperature of +50 degrees C., the power consumption dropped to 0.05 watt, after an initial surge to 0.58 watt during warm-up.

Flint glass as the insulating medium has the advantage that, unlike some plastics, it does not out-gas any materials that would contaminate some electronic components, such as surface acoustic wave (SAW) devices. Other materials that are compatible with SAW devices include barium titanate as a PTC material and RTV silicone as an adhesive.

It will be appreciated from the foregoing that the present invention represents a significant advance in the field of packaging of temperature-sensitive components. In particular, the invention provides an inexpensive technique for regulating the temperature of electronic components, especially in hybrid packages. It will also be appreciated that, although specific embodiments of the invention have been described in detail for purposes of illustration, various modifications may be made without departing from the spirit and scope of the invention. Accordingly, the invention is not to be limited except as by the appended claims.

I claim:

1. A temperature-stabilizing device for regulating the operating temperature of an electronic component that is to be mounted on a package, said device comprising:
   a positive-temperature-coefficient thermistor mounted in thermal contact with the electronic component whose temperature is to be regulated; and
   an insulating body mounted between said thermistor and the package, said insulating body including a length of tubing that has been deformed to provide two flat surfaces for contact with said thermistor and with the package, respectively, whereby the interior volume of said tubing increases the thermal resistance of the path between said thermistor and the package;
   said tubing being of a material that produces no contaminant gases.

2. A temperature-stabilizing device as set forth in claim 1, wherein:
   said tubing is of glass.

3. A temperature-stabilizing device as set forth in claim 1, wherein:
   said insulating body is of a material having the properties of low thermal conductivity on the order of less than 0.1 watt/cm-degree C. and low outgassing in vacuum.

4. A temperature-stabilizing device for regulating the operating temperature of an electronic component that is to be mounted on a package, said device comprising:
   a positive-temperature-coefficient thermistor mounted in thermal contact with the electronic component whose temperature is to be regulated;

an insulating body mounted between said thermistor and the package, said insulating body being of a material that produces no contaminant gases, and having included air spaces to increase the thermal resistance of the path between said thermistor and the package;

a second positive-temperature-coefficient thermistor; and a second insulating body;

said second thermistor being positioned in contact with the first insulating body, and said second insulating body being positioned between said second thermistor and the package, to provide a second thermistor and insulator combination that is thermally in series connection with the first thermistor and insulator combination.

5. A temperature-stabilizing device as set forth in claim 4, wherein:
said first and second insulating bodies each include a length of tubing that has been deformed to provide two flat contact surfaces; and
the included air space is provided by the interior volume of the tubing.

6. A temperature-stabilizing device as set forth in claim 5, wherein:
said lengths of tubing are of glass.

7. A temperature-stabilizing device as set forth in claim 4, wherein:
said insulating bodies are of a material having the properties of low thermal conductivity on the order of less than 0.01 watt/cm-degree C. and low outgassing in vacuum.

* * * * *